United States Patent
Hung et al.

(10) Patent No.: US 7,176,815 B1
(45) Date of Patent: Feb. 13, 2007

(54) VIDEO CODING WITH CABAC

(75) Inventors: Ching-Yu Hung, Plano, TX (US);
Shraddha Gondkar, Richardson, TX (US); Jagadeesh Sankaran, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/235,586

(22) Filed: Sep. 26, 2005

Related U.S. Application Data

(60) Provisional application No. 60/612,996, filed on Sep. 24, 2004.

(51) Int. Cl.
*H03M 7/30* (2006.01)
*G06K 9/36* (2006.01)

(52) U.S. Cl. ...................... 341/107; 382/247

(58) Field of Classification Search ............... 341/107; 382/247; 708/205, 210, 211, 550
See application file for complete search history.

(56) References Cited

U.S. PATENT DOCUMENTS

| | | | | |
|---|---|---|---|---|
| 4,467,317 A | * | 8/1984 | Langdon et al. | 341/107 |
| 4,652,856 A | * | 3/1987 | Mohiuddin et al. | 341/60 |
| 4,905,297 A | * | 2/1990 | Langdon et al. | 382/247 |
| 6,765,515 B2 | * | 7/2004 | Miyamoto | 341/107 |
| 2006/0017591 A1 | * | 1/2006 | Bossen | 341/50 |

* cited by examiner

*Primary Examiner*—Howard L. Williams
(74) *Attorney, Agent, or Firm*—Carlton H. Hoel; W. James Brady; Frederick J. Telecky, Jr.

(57) ABSTRACT

Context-based adapative binary arithmetic coding (CABAC), as used in video standards such as H.264/AVC, with a renormalization of the interval low value plus range that includes partitioning of the bits of the low value to provide output bits plus low value update without bit-level iterations or aggregation of output bits until a full byte can be output.

4 Claims, 7 Drawing Sheets

VIDEO CODING WITH CABAC

CROSS-REFERENCE TO RELATED APPLICATIONS

This application claims priority from provisional application No. 60/612,996, filed Sep. 24, 2004.

BACKGROUND

The present invention relates to digital video signal processing, and more particularly to devices and methods for video coding.

There are multiple applications for digital video communication and storage, and multiple international standards have been and are continuing to be developed. Low bit rate communications, such as, video telephony and conferencing, led to the H.261 standard with bit rates as multiples of 64 kbps, and the MPEG-1 standard provides picture quality comparable to that of VHS videotape.

H.264/AVC is a recent video coding standard that makes use of several advanced video coding tools to provide better compression performance than existing video coding standards such as MPEG-2, MPEG-4, and H.263. At the core of all of these standards is the hybrid video coding technique of block motion compensation plus transform coding. Generally, block motion compensation is used to remove temporal redundancy between successive images (frames), whereas transform coding is used to remove spatial redundancy within each frame. FIGS. 2a–2b illustrate the H.264/AVC functional blocks which include quantization of transforms of block prediction errors (either from block motion compensation or from intra-frame prediction) and entropy coding of the quantized items. The entropy coding may be either context-adpative variable-length coding (CAVLC) or context-based adaptive binary arithmetic coding (CABAC).

The rate-control unit in FIG. 2a is responsible for generating the quantization step (qp) by adapting to a target transmission bit-rate and the output buffer-fullness; a larger quantization step implies more vanishing and/or smaller quantized transform coefficients which means fewer and/or shorter codewords and consequent smaller bit rates and files.

Marpe et al, Context-Based Adaptive Binary Arithmetic Coding in the H.264/AVC Video Compression Standard, 13 IEEE Trans. Circuits and Systems for Video Tech. 620 (July 2003) describes the CABAC of H.264/AVC. CABAC has three main constituents: binarization of the input symbol stream (quantized transformed prediction errors) to yield a stream of bins, context modeling (conditional probability that a bin is 0 or 1 depending upon previous bin values), and binary arithmetic coding (recursive interval subdivision with subdivision according to conditional probability). To limit computational complexity, the conditional probabilities are quantized and the interval subdivisions are repeatedly renormalized to maintain dynamic range.

However, the computational complexity of the CABAC of H.264/AVC is a problem, especially for mobile, battery-powered devices.

SUMMARY OF THE INVENTION

The present invention provides a modified renormalization for context-based adaptive arithmetic coding of the type as in H.264/AVC.

DESCRIPTION OF THE PREFERRED EMBODIMENTS

1. Overview

Figure 1A:
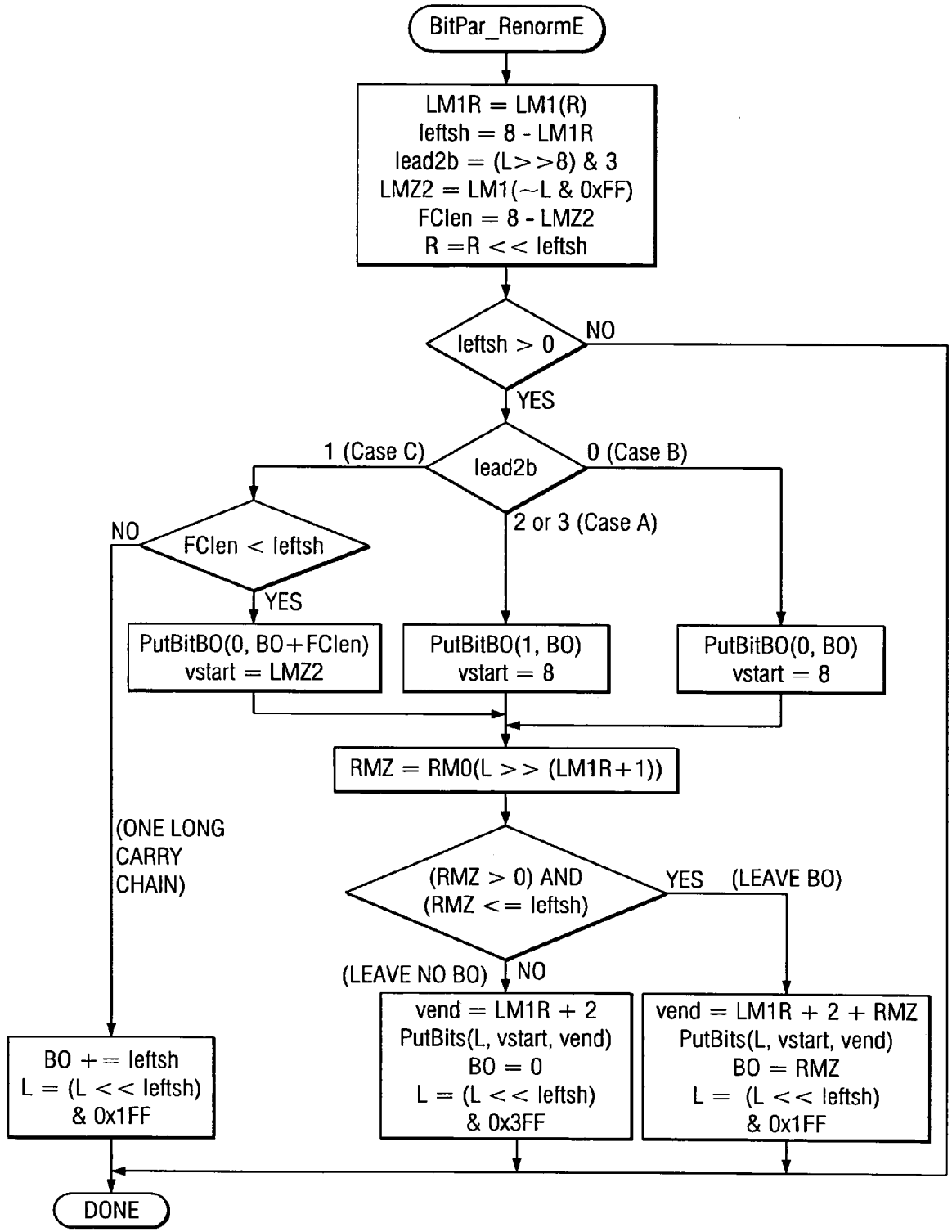
FIGS. 1a–1c are flowcharts for preferred embodiment renormalizations in arithmetic encoding.

Preferred embodiment arithmetic encoding renormalization methods of FIG. 1a partitions the low renormalization variable into three segments for output without the repeated loops which occur with outstanding bits in known renormalization methods. Alternative preferred embodiment method of FIG. 1c further extends the number of bits in the low renormalization variable and thereby allows for output on a byte scale.

Figure 3B:
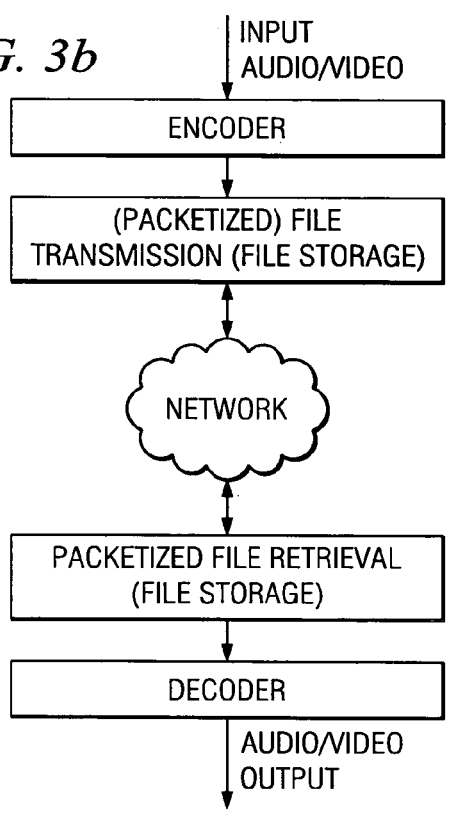
FIGS. 3a–3b illustrate processor and network.
Figure 3A:
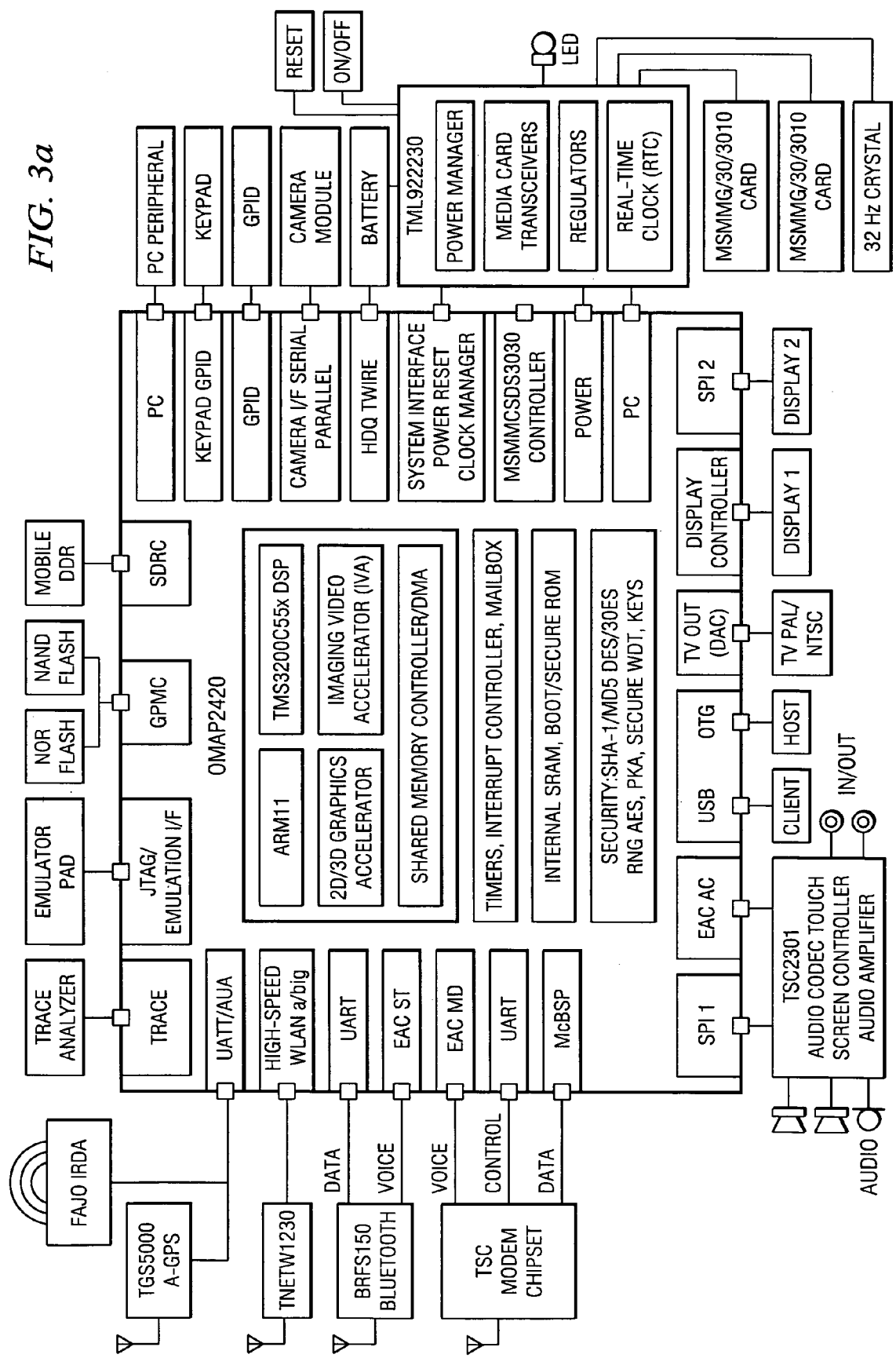

Preferred embodiment systems (e.g., cellphones, PDAs, digital cameras, notebook computers, etc.) perform preferred embodiment methods with any of several types of hardware, such as digital signal processors (DSPs), general purpose programmable processors, application specific circuits, or systems on a chip (SoC) such as multicore processor arrays or combinations such as a DSP and a RISC processor together with various specialized programmable accelerators (e.g., FIG. 3a). A stored program in an onboard or external (flash EEP) ROM or FRAM could implement the signal processing methods. Analog-to-digital and digital-to-analog converters can provide coupling to the analog world; modulators and demodulators (plus antennas for air interfaces such as for video on cellphones) can provide coupling for transmission waveforms; and packetizers can provide formats for transmission over networks such as the Internet as illustrated in FIG. 3b.

2. CABAC Preliminaries

First consider binary arithmetic coding which uses recursive interval subdivision. The jth (binary) symbol of an input symbol stream to be encoded has a less probable value ($l_j$) and a more probable value ($m_j$). Let $p_j$ denote the probability of the less probable value, so $q_j = 1 - p_j$, is the probability of the more probable value. Then the correspondence of a subinterval of the unit interval [0,1) with an input symbol stream proceeds as follows. For the first symbol, divide the interval into [0, $q_1$) and [$q_1$, 1) which correspond to the two possible symbol values $m_1$ and $l_1$, respectively. That is, the interval is divided into two subintervals with lengths proportional to the probabilities. Now a decision is made according to the actual value of the first symbol: if the first symbol has the more probable value $m_1$, select the corresponding subinterval [0, $q_1$) to be the new interval and proceed to the second symbol; but if the first symbol has the less probable value $l_1$, then select the subinterval [$q_1$, 1) to be the new interval and proceed to the second symbol. For the second symbol, again divide the (selected) interval into two subintervals with lengths proportional to the probabilities $q_2$ and $p_2$ of the possible values $m_2$ and $l_2$, respectively. For example, if [$q_1$, 1) were the interval selected by the first symbol decision, divide it into [$q_1$, $q_1+p_1 q_2$) and [$q_1+p_1 q_2$, 1). Then as with the first symbol, a decision is made according to the actual value of the second symbol to select one of these two subintervals to be the new interval for the third symbol. Note that the length of the selected subinterval is equal to the joint probability of the corresponding first and second symbol values. Indeed, there are four possible two-symbol sequences: $m_1\ m_2$, $m_1\ l_2$, $l_1\ m_2$, and $l_1\ l_2$, and the corresponding subintervals are $[0, q_1\ q_2)$, $[q_1 q_2, q_1)$, $[q_1, q_1+p_1\ q_2)$, and $[q_1+p_1\ q_2, 1)$, respectively, which have lengths $q_1 q_2$, $q_1 p_2$, $p_1 q_2$, and $p_1 p_2$, respectively, which are the joint probabilities of the corresponding symbol sequence values. (Using $p_j+q_j=1$ would simplify the interval notation.)

The recursion can thus be characterized as follows. Denote the interval selected after the jth symbol decision as $[L_j, H_j)$, and denote the length (range) of this interval as $R_j(=H_j-L_j)$, so the interval can also be written as $[L_j, L_j+R_j)$. Then for the (j+1)st symbol the interval is divided into $[L_j, L_j+q_{j+1}\ R_j)$ and $[L_j+q_{j+1}\ R_j, L_j+q_{j+1}\ R_j+p_{j+1}\ R_j)$. In other words, either $L_{j+1}=L_j$ and $R_{j+1}=q_{j+1}\ R_j$ when the (j+1)st symbol takes its more probable value, or $L_{j+1}=L_j+q_{j+1}\ R_j$ and $R_{j+1}=p_{j+1}\ R_j$ when the (j+1)st symbol takes its less probable value; see FIG. 1b. Of course, the probabilities $q_{j+1}$ and $p_{j+1}$ can depend upon the interval being subdivided (i.e., context-based adaptation).

The foregoing interval subdivision process can be inverted in the sense that given (a point in) a final interval, the sequence of symbol values (decisions made) can be recovered by regenerating the selections according to which subinterval contains (the point in) the final interval.

Practical implementations have limited precision, so the interval [L, H) is shifted and/or renormalized whenever R gets small enough. When the leading bits of L and H are identical (and thus will not change in subsequent interval subdivisions), these bits can be put into the output bitstream and L and H scaled up (left shifted). Further, practical implementations eliminate the multiplications (e.g., $p_{j+1}, R_j$) by approximations such as quantizing the probabilities and the range so the multiplication can be replaced by a lookup table.

Figure 4A:
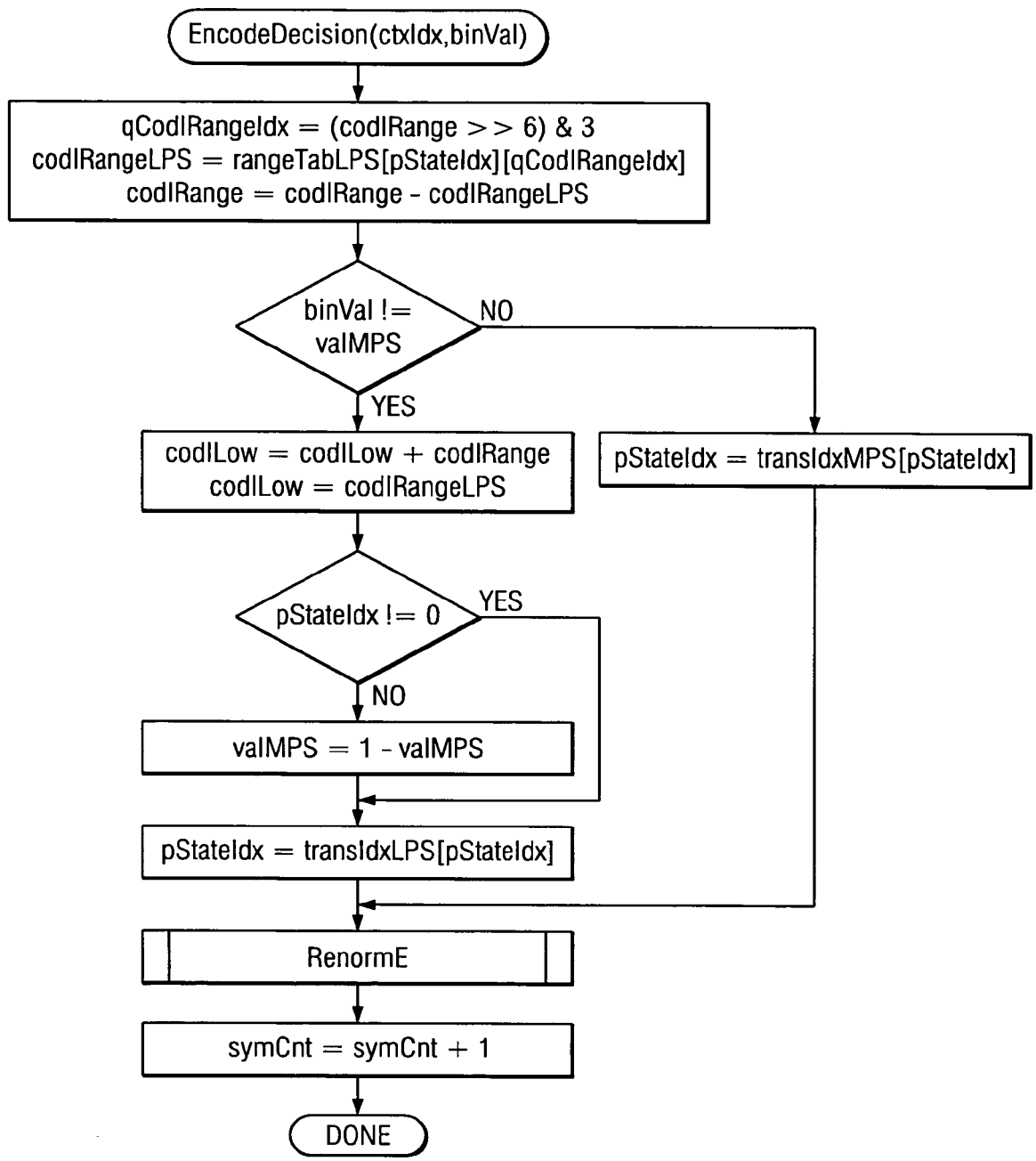
FIGS. 4a–4c are flowcharts for known arithmetic encoding.

For H.264/AVC with integer format L is confined to the range [0, 1024) and thus takes 10 bits to represent (bit 9 is MSB and bit 0 is LSB); R is to lie in the range [0, 512) and thus takes 9 bits to represent. To maintain dynamic range, renormalization keeps R in the range [256, 512). The probabilities are limited to 64 possibilities (in a lookup table) for each of four quantized values of R and thereby eliminate multiplications. FIG. 4a is a flowchart for the H.264 recursion with the following variables: codlLow is the 10-bit representation of (shifted and renormalized) $L_j$; codlRange is the 9-bit representation of (renormalized) $R_j$; binVal is the current symbol actual value; ValMPS is the current symbol more probable value, qcodlRangeIdx is a quantization of codlRange to use as an index for lookup in the probabilities table rangeTabLPS; pStateIdx is the context (probability) state index; transIdxLPS and transIdxMPS are context state transition rules; and RenormE is the renormalization function which includes the putting bits into the output bitstream.

Figure 4B:
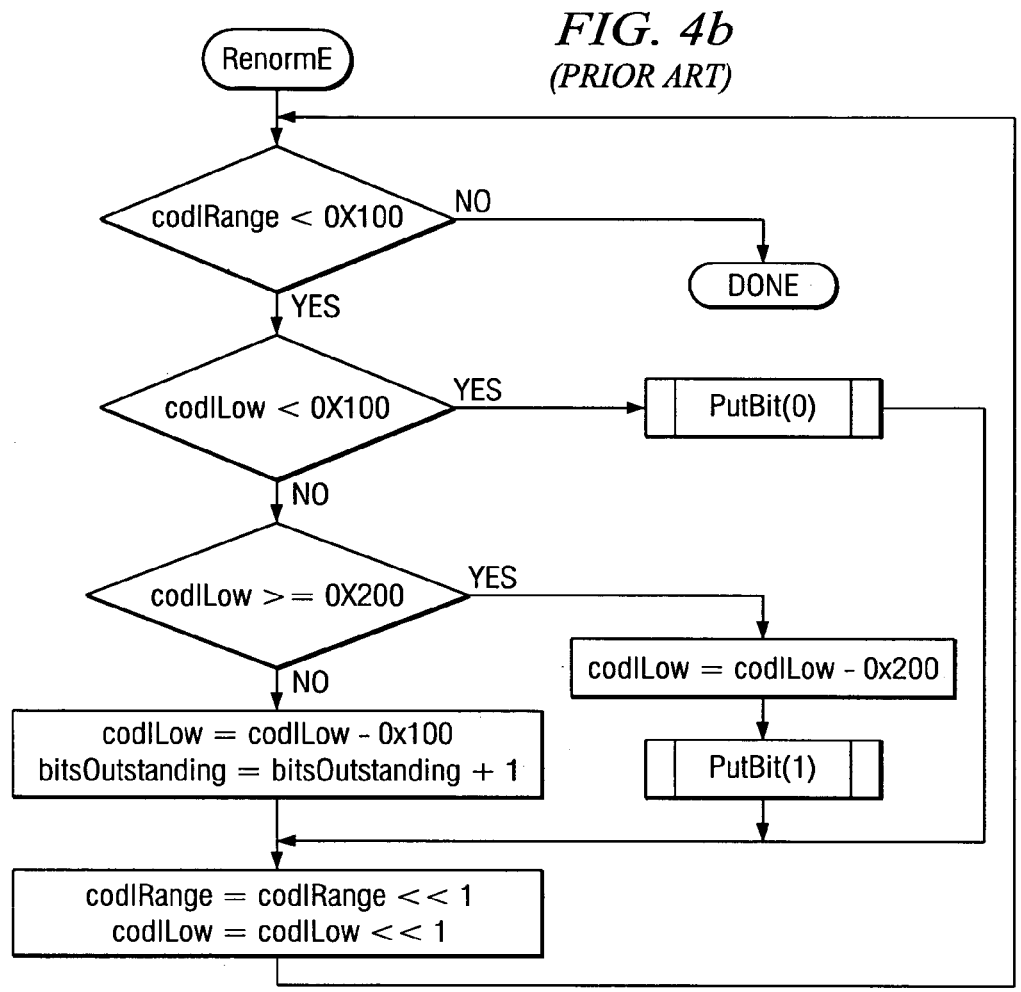
Figure 4C:
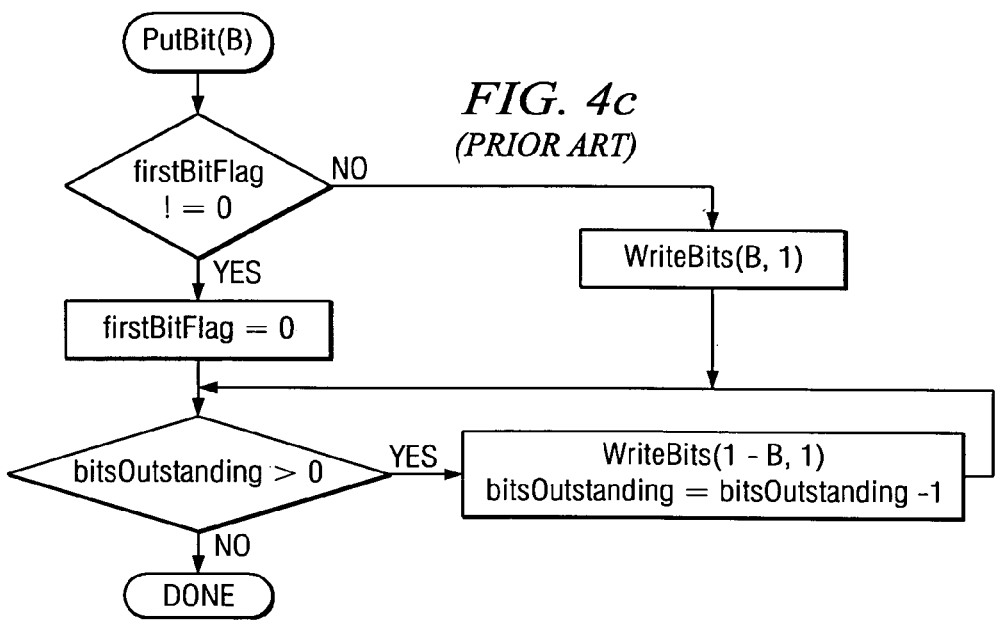

FIG. 4b is a flowchart of RenormE, and FIG. 4c is the flowchart for the PutBit( ) function used in RenormE; the function WriteBits(B,N) writes N bits with value B to the bitstream and advances the bistream point by N bits positions.

For an input binary symbol value binVal with probability context index ctxIdx (corresponding to the less probable symbol probability $p_{j+1}$), the FIG. 4a operation has the following steps:

(1) Quantize the current $R_j$ by right shift 6 bits (leaving only 3 bits) and then mask with 011; this effectively partitions the range of R values into four classes (0–63∪256–319; 64–127∪320–383; 128–191∪384–447; and 192–255∪448–511).

(2) Use the context index (ctxIdx) of the input symbol together with the quantization of $R_j$ from (1) to lookup an approximation to the less probable new range $p_{j+1}\ R_j$ from a 256-entry table (rangeTabLPS); this approximation is denoted codlRangeLPS.

(3) Find the complementary approximation for the more probable $q_{j+1}\ R_j$ simply by subtracting the approximation for the less probable (codlRangeLPS) from the current $R_j$(codlRange), and denote this as codlRange. Note that $R_{j+1}$ will thus be codlRange except when the less probable symbol value occurs.

Figure 1B:
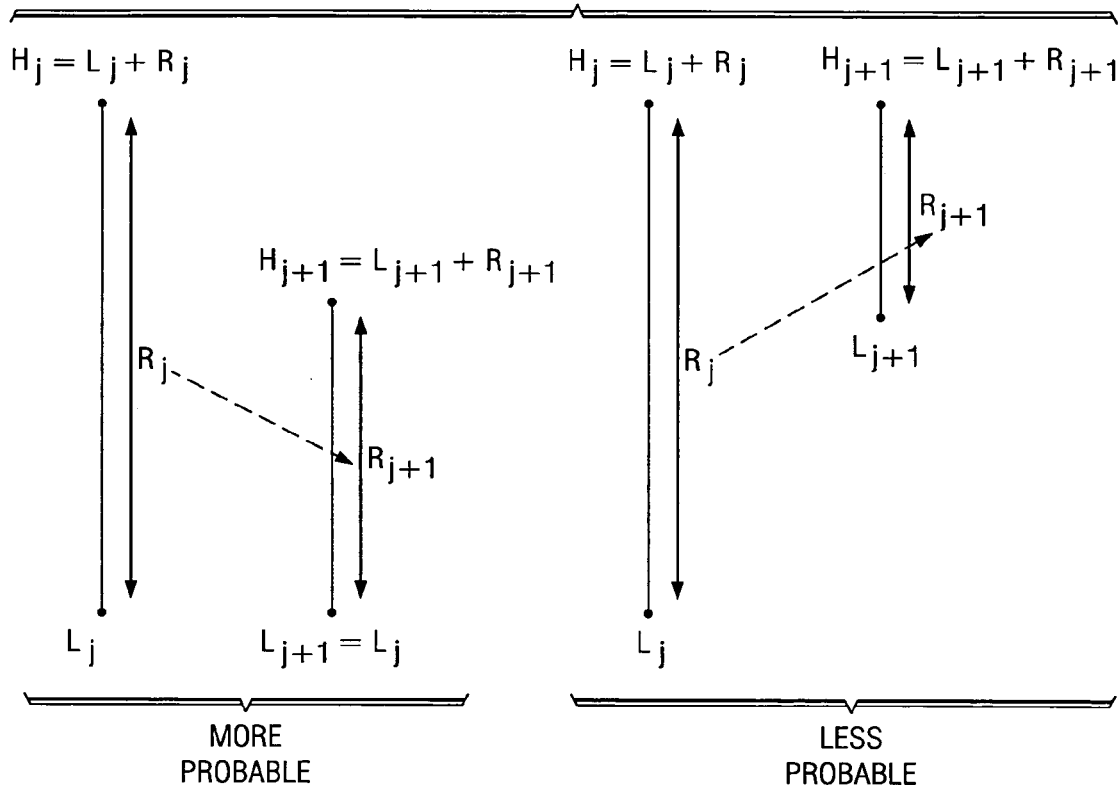

(4) If the input symbol value (binVal) is the more probable symbol value (valMPS), then make the MPS state transition, call the RenormE function, and increment the symbol counter (symCnt) as shown in the righthand branch of FIG. 4a; this corresponds to the left portion of FIG. 1b where $L_{j+1}=L_j$ is unchanged and $R_{j+1}=q_{j+1}\ R_j$ which already has been done by updating codlRange in (3). In contrast, if the input binVal is the less probable value, then adjust both the interval lower end (codlLow=codlLow+codlRange) and change $R_{j+1}$ to the approximation of the less probable $p_{j+1}\ R_j$(codlRange=codlRangeLPS), make the LPS state transition, call the RenormE function, and increment the symbol counter as shown in the lefthand branch of FIG. 4a; this corresponds to the right portion of FIG. 1b where $L_{j+1}=L_j+q_{j+1}\ R_j$ and $R_{j+1}=p_{j+1}\ R_j$.

RenormE computes any available bits for output together with corresponding renormalization (scaling) adjustments of the new L, R interval prior to the next input symbol. Calling RenormE first checks whether R is small enough to double (codlRange<256), if not, the function does nothing (far lefthand portion of FIG. 4b). So presume R<256; then there are three cases to consider. In the first case L (codlLow) is also <256, so H=L+R<512 and the most significant bit (leading bit 9) of both H and L is 0. Consequently, this bit can be taken out of L and put into the bitstream, and R and L can then be doubled and still remain in their allowed ranges. See the lefthand branch of FIG. 4b; codlLow<<1 and codlRange<<1 is the doubling. Of course, this doubling by left shifting discards the most significant (leading) bit from both R and L. After this doubling, the new R is again checked to see whether it can be doubled again (R<256) and so repeat the process.

In the second case L (codlLow)≧512. In this case the leading bit of both H and L is 1, so this bit can be taken out of L and put into the bitstream, and R and L doubled. To avoid overflow bit 9 is zeroed out in L (codlLow=codlLow−512) prior to the left shift for doubling; see the righthand branch of FIG. 4b. Again, the new R is checked to see whether it can be doubled again and the process repeated.

In the third case (512>L≧256) the leading two bits of L (bits 9 and 8) are 01 and the leading two bits of H can be either 01 or 10, so the leading bit is ambiguous and cannot yet be sent to the output bitstream. Indeed, the next input symbol (and thus next call of RenormE) may either reduce H and a 0 will be put into the bitstream or increase L and a 1 will be put into the bitstream. In more detail, when the (L, H) interval includes the point 10 0000 0000 as an interior point, L may look like 01 111 . . . while H may look like 10 000 . . . ; and so either 01111 or 10000 will eventually be output depending upon whether subsequent input symbol(s) select a subinterval on the low side or on the high side of 10 0000 0000, respectively. RenormE handles this leading bit ambiguity by effectively counting the bits (bitsOutstanding) following the leading bit which will be complements of the leading bit and deferring output until determination of the leading bit. In this third case, bit 8 of L is changed from 1 to 0 (codlLow−256) with a compensating increment of bitsOutstanding, and this allows for the doubling as in the first case. In effect, for L=01 111 . . . while H=10 000 . . . ; subtracting 256 converts this to the first case with L=00 111 . . . and H=01 000 . . . , and so if the more probable symbol occurs next to yield a 00111 output, then adding the subtracted 256 back gives 01111; whereas, if the less probable symbol occurs next ot yield a 01000 output, then adding the subtracted 256 back gives 10000, as desired.

However, RenormE contains a loop that runs multiple iterations, and in the loop variable L is updated in a nontrivial way, making it difficult to carry out the multiple iterations in one pass. The PutBit( ) procedure called by RenormE also contains a loop. The PutBit( ) procedure is not difficult to translate into bit parallel operations, but it contains bit-level processing that consumes computation time. RenormE can call PutBit( ) multiple times. The preferred embodiment versions of RenormE overcome these computational complexities.

3. Bit-Parallel Preferred Embodiment

To overcome the RenormE procedure complexities, we need to analyze its iteration behavior and understand how renormalization is achieved through the iteration behavior. To do these, first we should understand, in a higher level, the purpose of renormalization in arithmetic coding. The goal of the renormalization is twofold:

Adjust the radix point so that R, range, is normalized to between 256 and 511.

Extract bitstream output, of the bits that are guaranteed not to change.

The first goal is easy to achieve, as it involves detecting the left-most 1 bit in R and left-shift R and L with the same shift count so that 256≦R<512. This range is where the table lookup-based arithmetic coding operates.

The second goal can be understood better by looking at the principle of arithmetic coding. In arithmetic coding, we adjust R and L maintain an interval in a real number space, in both the encoder and decoder. The bitstream output is really a long binary number (say N bits long) that encodes a number with good enough precision ($2^{-N}$). The encoder constructs this number so that when the decoder gets it, the decoder can recover the interval. FIG. 1b shows H=L+R, and adjustment of L, R, and H while encoding a binary symbol. Observe that R gets smaller, and L either stays the same or gets increased by an amount less than R. Bits that are produced from the arithmetic encoder are the bits common between L and H. This is so that when decoder gets the bitstream, thus this very precise number, it is able to recover the MPS/LPS decision without ambiguity.

We see that, in encoding a single symbol, L is either not changed, or is incremented, and H is either not changed, or decremented. The interval sub-partition nature of arithmetic coder means that the interval can only gets smaller later and later interval must always confine to the current interval. Thus, bits that the encoder can send are the common bits between current L and H=L+R, because future intervals cannot extend above/below the current interval.

Given that the purpose of renormalization is to normalize R and to produce output bits, we examine the decisions in FIG. 4b. As previously noted, there are three cases from the two decisions on L:

A) L>=0x200 (=512)
B) L<0x100 (=256)
C) 0x100<=L<0x200

Case A is when L is large enough that a '1' bit is generated.
Case B is when L is small enough so that L+R is guaranteed to be less than 0x200, and a '0' bit should be generated. Case C is when there's ambiguity, and we delay generating bits until L falls into either Case A or Case B.

Whenever one bit is produced, we check to see if BO (bitsOutstanding) is nonzero. If so, that one bit is followed with BO bits of the complement.

Looking into the logic in Case C, we can see that, by deducting 0x100 from L, we are detecting the string "011 . . . 1" in L, from the leading bit (bit 9). Deduction of 0x100 from L is just a convenient mechanism to count the length of the consecutive ones after the first zero. Thus, we detect the presence of "011 . . . 1", and increment BO by the number of consecutive ones. When/if there's a definite 0 bit, we produce "011 . . . 1" to the bitstream. When/if there's a definite 1 bit, carry is propagated throughout the outstanding bits, and we produce "100 . . . 0" to the bitstream.

Note that once RenormE falls into Case C, it will keep going into Case C, until reaching a second 0 bit that forces it to go into Case B, or doubling R crosses 0x100 first and the renormalization is done before the pattern terminates. We cannot have a transition from Case C to Case A inside a single RenormE call. In other words, carry propagation is possible only for the first iteration of each call. This makes sense because L doesn't change its true value during renormalization. However, after encoding another binary symbol, L might be incremented (by coding a less probable symbol; right side of FIG. 1b) and lead to carry propagation.

Also note that once we have a transition from Case C to Case B, we produce a '0' bit then BO '1' bits. This is just copying bits from L verbatim. Any Case C pattern, "011 . . . 1" that terminates inside a RenormE call will just copy bits verbatim to the bitstream. The Case C pattern that sticks to the last of L bits in a call leads to nonzero BO output.

Thus we come to the realization that, what RenormE does is:

If we have Case A or B on the first bit, we use up any outstanding bits from the previous call(s) of RenormE.
If we start with Case C, look for the second 0 bit in L to use up the outstanding bits (including any leftover from the previous call).
Once outstanding bits are used, we copy bits in L verbatim, until a final 01 . . . 1 in L.
There's "011 . . . 1" at the end of L bits leaving outstanding bits from this call.

The number of bits in L that we're sensing is the number of bits to left-shift R in order to normalize it, plus one.

A few examples will help illustrate the foregoing analysis of the RenormE procedure. Because RenormE only uses R as an indicator for how many iterations (with doublings of R and L) to execute, the examples just consider the number of R doublings (i.e., the number of leading 0s) as a variable and focus on L and the corresponding case A, case B, or case C status. Note the last two bits of L cannot affect a call of RenormE because of the lower limit on the size of the entries of rangeTabLPS. Further, let N denote the input bitsOutstanding (BO) at the beginning of the RenormE call.

A first example (input L=10 1010 10xx) illustrates all three cases.

(a) input L=10 1010 10xx; so L≧512 and case A applies (right branch of FIG. 4b) which has three steps: L=L−512 (=00 1010 10xx), PutBit(1), and double R and L by left shifts. PutBit(1) outputs 10 . . . 0 with N 0s from the input BO=N and decrements BO to 0; and the doubling provides the update to: L=01 0101 0xx0.

(b) if R can be doubled a second time, then case C applies because 512>L≧256. Thus the three steps: L=L−256 (=00 0101 0xx0), increment BO (to 1), and double R and L by left shifts. No bits are output and the doubling provides the update to: L=00 1010 xx00.

(c) if R can be doubled a third time, then case B applies because 256>L. Hence, two steps: PutBit(0) and double R and L by left shifts. PutBit(0) writes a 01 (BO=1 provides the 1) and decrements BO to 0; and the doubling provides the update to: L=01 010x x000.

(d) if R can be doubled a fourth time, then back to case C because 512>L≧256. Thus the three steps: L=L−256 (=00 010x x000), increment BO (to 1), and double R and L by left shifts. No bits are output and the doubling provides the update to: L=00 10xx 0000.

(e) if R can be doubled a fifth time, then case B reappears because 256>L. Hence, two steps: PutBit(0) and double R and L by left shifts. PutBit(0) writes a 01 (BO=1) and decrements BO to 0; and the doubling provides the update to: L=01 0xx0 0000.

(f) if R can be doubled a sixth time, back to case C because 512>L≧256. Thus three steps: L=L−256 (=00 0xx0 0000), increment BO (to 1), and double R and L by left shifts. No bits are output and the doubling provides the update to: L=00 xx00 0000.

(g) if R can be doubled a seventh time (the maximum), then again case B occurs with PutBit(0) outputting 01 and decrementing BO to 0, and the updating to: L=0x x000 0000.

Note that the output updated L always has its leading bit set to 0 and this bit corresponds to the final bit of the set of leading bits considered in the original L; the rest of the set of leading bits considered are lost in the shifts.

The following table summarizes this first example which begins in case A:

| Numb of R leading 0s | Leading bits of L | Bits out for BO = 0 input | Bits out for BO = 1 input | Bits out for BO = 2 input | BO output |
|---|---|---|---|---|---|
| 1 | 10 | 1 | 10 | 100 | 0 |
| 2 | 101 | 1 | 10 | 100 | 1 |
| 3 | 1010 | 101 | 1001 | 10001 | 0 |
| 4 | 10101 | 101 | 1001 | 10001 | 1 |
| 5 | 101010 | 10101 | 100101 | 1000101 | 0 |
| 6 | 1010101 | 10101 | 100101 | 1000101 | 1 |
| 7 | 10101010 | 1010101 | 10010101 | 100010101 | 0 |

A second example; input L=01 1101 11xx begins in case C and the front carry chain continues incrementing BO until a 0 appears to enter case B:

| Numb of R leading 0s | Leading bits of L | Bits out for BO = 0 input | Bits out for BO = 1 input | Bits out for BO = 2 input | BO output |
|---|---|---|---|---|---|
| 1 | 01 | none | none | none | N + 1 |
| 2 | 011 | none | none | none | N + 2 |
| 3 | 0111 | none | none | none | N + 3 |
| 4 | 01110 | 0111 | 01111 | 011111 | 0 |
| 5 | 011101 | 0111 | 01111 | 011111 | 1 |
| 6 | 0111011 | 0111 | 01111 | 011111 | 2 |
| 7 | 01110111 | 0111 | 01111 | 011111 | 3 |

A third example; input L=00 0111 00xx begins in case B:

| Numb of R leading 0s | Leading bits of L | Bits out for BO = 0 input | Bits out for BO = 1 input | Bits out for BO = 2 input | BO output |
|---|---|---|---|---|---|
| 1 | 00 | 0 | 01 | 011 | 0 |
| 2 | 000 | 00 | 010 | 0110 | 0 |
| 3 | 0001 | 00 | 010 | 0110 | 1 |
| 4 | 00011 | 00 | 010 | 0110 | 2 |
| 5 | 000111 | 00 | 010 | 0110 | 3 |
| 6 | 0001110 | 000111 | 0100111 | 01100111 | 0 |
| 7 | 00011100 | 0001110 | 01001110 | 011001110 | 0 |

A fourth example shows the effect of multiple leading 1s which is another case A; input L=11 1001 01xx:

| Numb of R leading 0s | Leading bits of L | Bits out for BO = 0 input | Bits out for BO = 1 input | Bits out for BO = 2 input | BO output |
|---|---|---|---|---|---|
| 1 | 11 | 1 | 10 | 100 | 0 |
| 2 | 111 | 11 | 101 | 1001 | 0 |
| 3 | 1110 | 111 | 1011 | 10011 | 0 |
| 4 | 11100 | 1110 | 10110 | 100110 | 0 |
| 5 | 111001 | 1110 | 10110 | 100110 | 1 |
| 6 | 1110010 | 111001 | 1011001 | 10011001 | 0 |
| 7 | 11100101 | 111001 | 1011001 | 10011001 | 1 |

Thus each leading 0 in R implies a bit decision: either output or defer with an increment of the number of bits outstanding (carry chain situation).

3. Bit-Parallel Renormalization

The preceding analysis concludes that the bits in the section of L we are looking at (the leading M+1 bits if R has M leading 0s) can be partitioned into three characteristic sections:

Front carry chain "01 . . . 10" that merges with previous BO into a 0-terminated carry chain; or by the absence of front carry chain either leading "1" to 1-terminate the previously outstanding carry chain, or leading "00" to 0-terminate the previously outstanding carry chain.

Middle bits to copy verbatim.

Back carry chain "01 . . . 1" to leave as BO, bits outstanding.

There are degenerate cases: not having a front carry chain, not having the middle bits, not having the back carry chain, or the whole section of L bits we look at constitutes one long carry chain. There is also a special case that all the L bits we look at are all 1s, which leads to Case A all the way through. This is a case that has no front or back carry chain; all bits are to be copied verbatim.

In particular, the second example has the front carry chain; all four of the examples have back carry chains for various numbers of leading 0s in R; and the first, third, and fourth examples have verbatim bits for various numbers of leading 0s in R plus a first bit which left-terminates any prior carry chain by appending BO complements when written to the bitstream.

FIG. 1a shows a flowchart of the preferred embodiment bit-parallel renormalization which can replace RenormE. It detects the presence and boundaries of the three sections in L, and produces output bits as well as renormalizes R and L in bit-parallel fashion plus updates BO. The following code implements FIG. 1a. The initial case A, case B, or case C possibilities appear in the if (lead2b== . . . ) . . . statements; and whether there is a back 01 . . . 1 (which implies outstanding bits created) or a final 0 (no outstanding bits) follows from the if (RMZ>0 && RMZ<=leftsh) . . . statements. The copy bits verbatim appears in the for (i=vstart; i>=vend; i—) bits[bptr++]=((low>>i) & 1) ? '1': '0'; statements with vstart and vend the start and end of the verbatim section.

```
void fast_renorme_v01(
    int range, /* R input */
    int low, /* L input */
    int BO, /* BO input, complement bits to follow */
    int *range_out, /* R output */
    int *low_out, /* L output */
    int *BO_out, /* BO output */
    char *bits)/* output bits */
{
    int LM1R, leftsh, lead2b, LMZ2, RMZ, FClen;
    int bptr, vstart, vend, lastbL, i, L2;
    LM1R=LM1(range);
    leftsh=8–LM1R;
    lead2b=(low>>8) & 3;
    bptr=0;
    if (leftsh==0) {/* R>=0x100 already, return */
        *range_out=range;
        *low_out=low;
        *BO_out=BO;
        bits[0]=0;
        return;
    }
    *range_out=(range<<leftsh) & 0x1FF;
    if (lead2b==1) {/* 01: carry chain continues; case C */
        LMZ2=LM1(~low & 0xFF); /* leading 0 from bit 7 */
        FClen=8–LMZ2;
        if (FClen>=leftsh) {/* cannot terminate carry chain */
            *BO_out=BO+leftsh;
            *low_out=(low<< leftsh) & 0x1FF;
            bits[bptr]=0;
            return;
        }
        else {/* terminate carry chain with 0 */
            bits[bptr++]='0';
            for (i=0; i<BO+FClen; i++)
                bits[bptr++]='1';
            vstart=LMZ2;
        }
    }
    else if (lead2b>=2) {/* 1x: terminate carry chain with 1; case A */
        bits[bptr++]='1';
        for (i=0; i<BO; i++)
            bits[bptr++]='0';
        vstart=8;
    }
    else if (lead2b==0) {/* 00: terminate carry chain with 0; case B */
        bits[bptr++]='0';
        for (i=0; i<BO; i++)
            bits[bptr++]='1';
        vstart=8;
    }
```

```
L2=(low>>(LM1R+1));
RMZ=RM0(L2); /* right most zero */
lastbL=(low>>(LM1R+1)) & 1;
if (RMZ>0 && RMZ<=leftsh) {/* last bit=1, unless all 1s,
end with
    carry chain */
    vend=LM1R+2+RMZ;
    *BO_out=RMZ;
    *low_out=(low<<leftsh) & 0x1FF;
}
else {
    vend=LM1R+2;
    *BO_out=0;
    *low_out=(low<<leftsh) & 0x3FF;
}
for (i=vstart; i>=vend; i—) /* put verbatim bits */
    bits[bptr++]=((low>>i) & 1) ? '1': '0';
    bits[bptr]=0;
}
```

The procedures/functions used in the bit-parallel method of FIG. 1a and the foregoing code are:
  LM1( ) detects the left-most 1 of the operand and returns the bit index (numbered with bit 0 as LSB). If the operand is zero, −1 is returned.
  RM0( ) detects the right-most 0 of the operand and returns the bit index.
  PutBitBO(X, N) writes out the bit X, followed by N bits of the complement of X.
  PutBits(X, N1, N2) writes out bits from the number X, from bit N1 to bit N2. If N2>N1, no bits are written out.

Variables used in the method are explained as follows:
  * LM1R=left most 1 bit index of R
  * leftsh=left shift to be applied on L and R, and defines the number of iterations in the original method.
  lead2b=leading two bits of L.
  LMZ2=second left most 0 bit index in L (the implementation assumes the left most L bit is 0, for which LMZ2 matters).
  RMZ=right most 0 bit index in L.
  * FClen=front carry chain length (number of consecutive ones following leading 0).
  vstart=bit index that starts the verbatim section of L.
  vend=bit index that ends the verbatim section of L.

It is worth noting that, the update of L only has two cases:
  L=(L<<leftsh) & 0x1FF
  L=(L<<leftsh) & 0x3FF Normally, by observing the number of bits we consumed in L, we should leave bit 9 alone, and use 0x3FF as the bit mask. When we have a back carry chain, in order to detect the possibility of carry generation from incrementing L in the next binary symbol encode, we clear bit 9, and use 0x1FF as the bit mask. The decision coincides with the eventual BO output. When BO is zero, we use 0x3FF. Otherwise, we use 0x1FF.

This observation points to a couple of simplified methods for L update. The first method is:
  LM1R=LM1(R);
  LM0L=LM1(~L & 0x3FF);
  if (LM0L<=LM1R) mask=0x3FF;
  else mask=0x1FF;

LM0L detects left-most 0 of L, starting from bit 9. This first method is saying, from bit 9, if we see first 1 bit from R no later than we see first 0 bit of L, the mask is set to 0x3FF. There are a few cases to consider:
  R=00 0000 1xxx
  1) L=11 1111 xxxx→mask=0x3FF
  2) L=xx xxx0 xxxx→mask=0x1FF
  3) L=xx 0xx1 xxxx→mask=0x1FF Case 1 leads to zero BO, and should have mask of 0x3FF. Case 2 leads to zero BO, and should get mask of 0x3FF. However, the bit to be ANDed with 0x200 is zero anyway, or it doesn't matter if the mask is 0x3FF or 0x1FF. Case 3 leads to nonzero BO and should get mask of 0x1FF.

The second method is based on the same principle, making use of the don't care of case 2 to simplify the logic:
  if ((L+2R) & 0x400) mask=0x3FF
  else mask=0x1FF Since the Case 2 above does not care about the decision, we only need to distinguish between Cases 1 and 3. The test (L+2R) & 0x400 detects carry propagation to bit 10, one bit higher than the MSB of L. Only when L has all 1s from bit LM1R+1 to the MSB (case 1) can we get a carry higher than the MSB. Therefore this is a valid test to tell cases 1 and 3 apart. The following code implements both alternatives, and verifies that both results match with the original method for computing the new L. In a real implementation we would only implement one method, preferably the third method which requires the fewest arithmetic steps.

```
void fast_renorme_v02(
    int range, /* R input */
    int low, /* L input */
    int BO, /* BO input, complement bits to follow */
    int *range_out, /* R output */
    int *low_out, /* L output */
    int *BO_out, /* BO output */
    char *bits) /* output bits */
{
    int LM1R;
    int LM0L;
    int leftsh;
    int low_mask1;
    int low_mask2;
    int alt_low_out1;
    int alt_low_out2;
    fast_renorme_v01(range, low, BO, range_out, low_out,
BO_out, bits);
    LM1R=LM1(range);
    LM0L=LM1(~low & 0x3FF);
    low_mask1=(LM0L<=LM1R) ? 0x3FF : 0x1FF;
    leftsh=8−LM1R;
    alt_low_out1=(low<<leftsh) & low_mask1;
    low_mask2=((low+2*range) & 0x400) ? 0x3FF : 0x1FF;
    alt_low_out2=(low<<leftsh) & low_mask2;
    if (PRINT_ALL || *low_out !=alt_low_out1 || *low_out
!=alt_low_out2)
        printf("Alternative low_out calculation: % x % x % x\n",
            *low_out, alt_low_out1, alt_low_out2);
}
```

4. Aggregate Byte-out renormalization

The Bit Parallel Renormalization preferred embodiment method eliminates the bit-level iteration in the RenormE of FIG. 4b. However, the logic to identify the presence and boundaries of the three sections of L is complicated. Replacing the RenormE iteration loop(s) with a complex set of operations means that, for the worst case, the computation is reduced, but for the average case that RenormE only iterates one or two times, the computation time may even go up. The Aggregate Byteout Renormalization preferred embodiment method produces output one byte at a time, and handles the carry propagation on byte-output boundaries to reduce the number of operations.

We can observe that, the bit parallel algorithm basically detects carry propagation between RenormE calls. Partitioning L into the front carry chain, verbatim section, and the back carry chain sections identifies the bits that can be safely written out. Since the increments in L is upper-bounded by R (which is well bounded through the renormalizations), we can delay carry propagation handling.

Figure 1C:
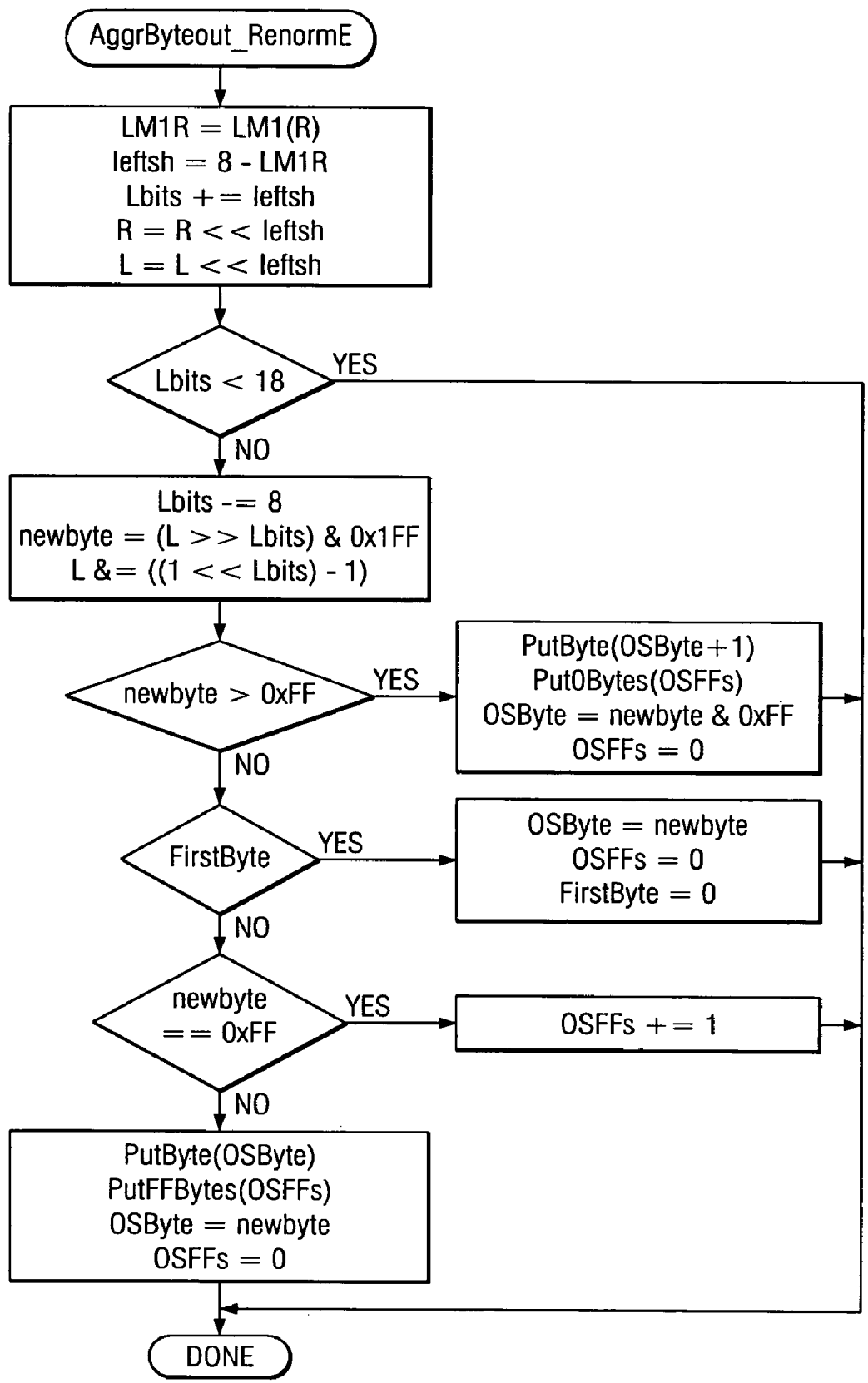
Figure 2A:
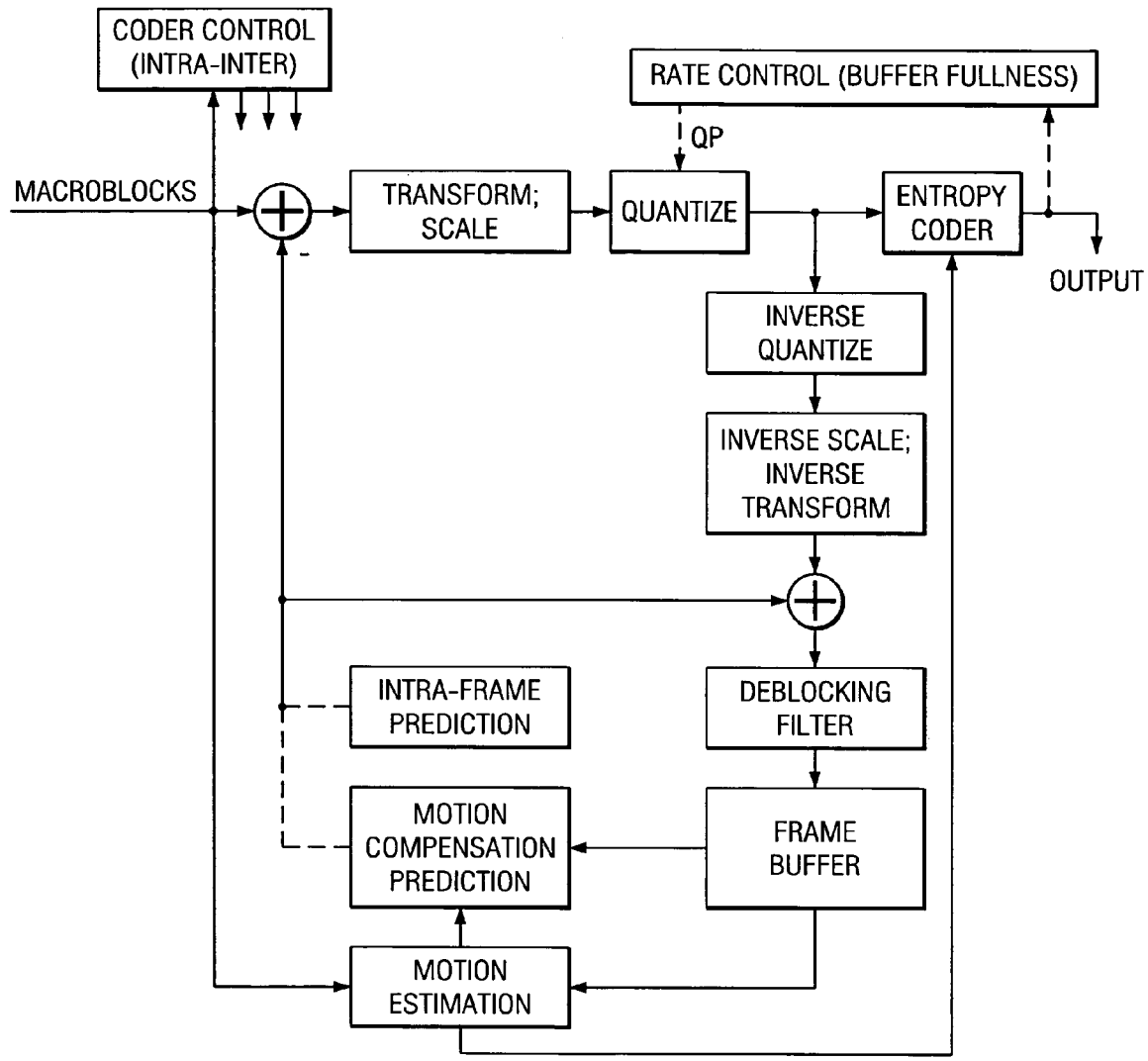
FIGS. 2a–2b show video coding functional blocks.
Figure 2B:
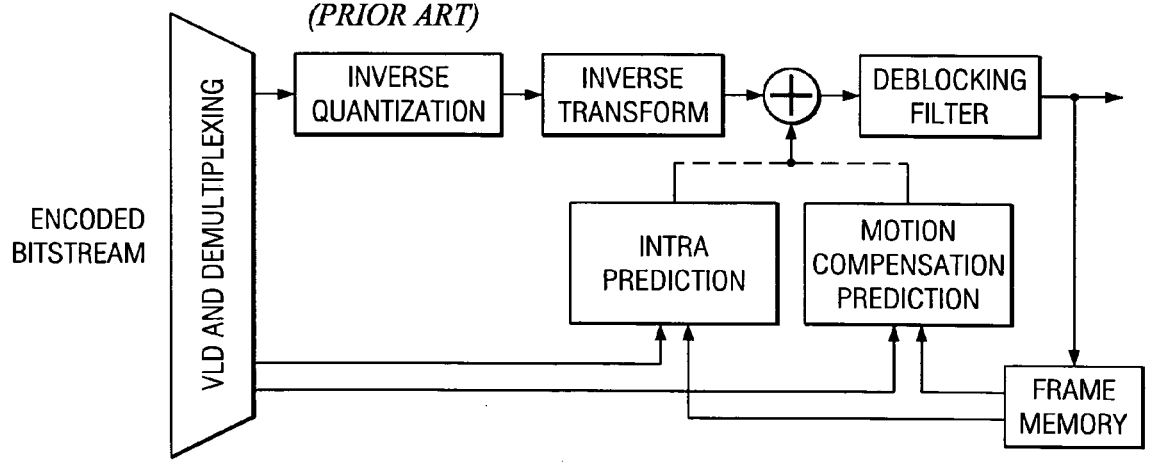

The idea is that, if we handle bitstream output at byte boundaries, we simplify the post processing of bitstream management. Carry propagation can be conveniently moved to the output byte boundaries. The flowchart of FIG. 1c shows the Aggregate Byteout Renormalization method and the following code implements the method.

```
void fast_renorme_v03(
    int range, /* R input */
    int low, /* L input */
    int lowbits, /* number of bits in L, 10 . . . 17*/
    int outstnd_data, /* outstanding data (non-FF) byte */
    int outstnd_ffs, /* number of outstanding FF bytes */
    int FirstByte,
    int *range_out, /* updated range, low, etc */
    int *low_out,
    int *lowbits_out,
    int *outstnd_data_out,
    int *outstnd_ffs_out,
    int *FirstByte_out,
    int *byteout1, /* first output byte */
    int *byteout1_flag, /* first output byte present */
    int *num_ffout, /* followed by this many FFS */
    int *change_ff_to_0)/* change FFS to 0s */
{
    int LM1R, leftsh, lead2bL, zp, zp2, carrylen;
    int bptr, vstart, vend, lastbL, i, L2;
    int newbyte;
    LM1R=LM1(range);
    leftsh=8−LM1R;
    lowbits=lowbits+leftsh;
    range=range<<leftsh;
    low=low<<leftsh;
    *change_ff_to_0=0; /* default */
    if (leftsh>8) {
    printf("ERROR in RenormE, range requires more than 8 left-shifts to normalize\n");
    exit(−2);
    }
    if (lowbits<18) {/* not sufficient bits to output */
    /* update low, lowbits, range */
    *low_out=low;
    *lowbits_out=lowbits;
    *range_out=range;
    /* other state var unchanged */
    *outstnd_data_out=outstnd_data;
    *outstnd_ffs_out=outstnd_ffs;
    *FirstByte_out=FirstByte;
    /* no output */
    *byteout1=0;
    *byteout1_flag=0;
    *num_ffout=0;
    }
    else {/* lowbits>=18, have at least 8 bits to output */
    lowbits−=8;
    newbyte=(low>>lowbits) & 0x1FF;
    low=low & ((1<<lowbits)−1);
    /* update low, lowbits, range */
    *low_out=low;
    *lowbits_out=lowbits;
    *range_out=range;
    *FirstByte_out=0; /* no longer first byte */
    if (newbyte>0xFF) {/* carry propagation */
        if (!FirstByte) {/* there's data byte outstanding, +1 and write out */
            *outstnd_data_out=newbyte; /* this byte becomes outstanding */
            *outstnd_ffs_out=0;
            *byteout1=outstnd_data+1;
            *byteout1_flag=1;
            *num_ffout=outstnd_ffs;
            *change_ff_to_0=1;
        }
        else {/* no data byte oustanding, cannot happen */
            printf("ERROR in RenormE, First Byte>0xFF\n");
        }
        }
        else if (FirstByte) {
        *outstnd_data_out=newbyte; /* new byte becomes outstnd */
        *outstnd_ffs_out=0;
        *byteout1=0;
        *byteout1_flag=0;
        *num_ffout=0;
        }
        else if (newbyte==0xFF) {
        *outstnd_data_out=outstnd_data;
        *outstnd_ffs_out=outstnd_ffs+1; /* append FF */
        *byteout1=0;
        *byteout1_flag=0;
        *num_ffout=0;
        }
        else {/* new byte<FF and not first */
        *outstnd_data_out=newbyte; /* new byte becomes outstnd */
        *outstnd_ffs_out=0;
        *byteout1=outstnd_data; /* push outstnd→byteout */
        *byteout1_flag=1;
        *num_ffout=outstnd_ffs; /* push FF→byteout */
        }
    }
}
```

Variables used in this method with FIG. 1c notation are explained as follows:
LM1R=left most 1 bit index of R
leftsh=left shift number of bits to be applied to both L and R
* Lbits=number of data bits in L (which now differs from L by maintaining additional leading bits), note that we also need to look at bit Lbits, which is one bit higher, for carry. Lbits should be initialized to 10.
OSByte=outstanding data byte
OSFFs=number of outstanding 0xFF bytes
FirstByte=flag to indicate very first byte output from L. FirstByte should be initialized to 0.

Outstanding byte (OSByte) and outstanding FFs (represented by OSFFs) are in-reserved data bytes in the procedure. Further calls are needed to confirm that they can be written out. As the encoding preceds, we might increment the outstanding FF count. The carry chain can be resolved by a carry, when the procedure writes out OSByte+1 followed by OSFFs number of zero bytes, or can be resolved by no carry, when the procedure writes out OSByte followed by OSFFs number of FFs.

The procedures used are self-explanatory:
   PutByte(X): write out byte value X
   Put0Bytes(N): write out N bytes of 0x00
   PutFFBytes(N): write out N bytes of 0xFF The code notation differs slightly: "L" becomes "low", "R" becomes "range", "Lbits" becomes "lowbits"; "OSByte" becomes "outstnd_data"; "OSFFs" becomes "outstnd_ffs"; "PutByte( . . . )" essentially becomes "*byteout1= . . . "; "Put0Bytes( . . . )" becomes "*num_ffout= . . . " together with "*change_ff_to_0=1"; "PutFFBytes( . . . )" becomes "*num_ffout= . . . ".

The Aggregate Byteout Renormalization method is simpler than the Bit Parallel method for either software or hardware implementation. This method is particularly suited for hardware implementation, due to the parallel alternate paths in the flowchart.

Note that the method deviates from the original method in the value of L. Since we accumulate bits in L until there's a full byte for output, we need to keep more bits in L than were in L. The addition in the Encode Binary Symbol process (see FIG. 4a lefthand portion: codlLow=codlLow+codlRange) needs to accept up to 18 bits of L as input, and 19 bits of output. Correspondence with the original method's L values, if desired for debug purposes, can be maintained in parallel with additional operations. For example,
   if ((L_orig+2R) & 0x400) mask=0x3FF
   else mask=0x1FF
   L_orig=L & mask This L_orig (i.e., L) variable should be incremented by $R-R_{LPS}$, along with L, when a less probable symbol is decoded.

Again, a few examples will help illustrate the preferred embodiment bytewise output renormalization method. As a first example, presume after a (less probable) symbol decoding that L=1010 1010 0111 xxxx and R=0 0010 yyyy. Lbits=16, and we assume FirstByte=false and there is no outstanding FFs. Now an AggrByteout_RenormE call proceeds as follows (presuming OSFFs=0 and that the first byte for output has already occurred):
   LM1R=LM1(R)=5
   leftsh=8−LM1R=3
   Lbits=Lbits+leftsh=19
   R=R<<leftsh=1 0yyy y000
   L=L<<leftsh=101 0101 0011 1xxx x000
   (Lbits<18)=false
   Lbits−=8 [so Lbits=11]
   newbyte=(L>>Lbits) & 0x1FF=1010 1010,
   L &=((1<<Lbits)−1)=011 1xxx x000
   (newbyte>0xFF)=false
   FirstByte=false
   (newbyte==0xFF)=false
   PutByte(OSByte) writes input OSByte to bitstream
   PutFFBytes(OSFFs) writes nothing due to presumed input OSFFs=0
   OSByte=newbyte=1010 1010
   OSFFs=0

Thus the first example followed the far righthand branch in FIG. 1c. Note that prior to the renormalization call H=1010 1010 1000 zzzz, and because a less probable symbol had been decoded, H had been unchanged from its prior value and L had increased from at least about 1010 1000 0000 0000. Consequently, even prior to the symbol decoding which led to the renormalization call, L and H had previously had common leading bits 101010 which had not yet been put into the output queue (OSByte) due to a full byte not yet being available.

As a second example, consider the same input as the first example except with L=1111 1111 0111 xxxx. This will give the same initial step results except newbyte=1111 1111 which changes (newbyte==0xFF) from false to true. This is the carry chain situation and OSFFs+=1 replaces the PutByte( ) . . . steps. See the second-to-the-right branch in FIG. 1c. A positive OSFFs will be used up in a later iteration, in either the PutFFBytes(OSFFs) of the far right branch of FIG. 1c when the leading bits of L have prevailed or the Put0Bytes(OSFFs) of the second-to-the-left branch when the leading bits of H have prevailed.

A third example illustrates this second-to-the-left branch. First, presume that after a renormalization call L=1111 1111 1000 xxxx with Lbits=16 and R=1 1010 yyyy; this implies H=1 0000 0001 001z zzzz and there is ambiguity in the leading bits of L and H. Next, presume that a less probable symbol is decoded which (from tabRangeLPS) has $R_{LPS}$=0 0010 yyyy; this implies L is increased to $L+(R-R_{LPS})$=1 0000 0001 0000 xxxx and R is updated to $R=R_{LPS}$=0 0010 yyyy. Note that L now has its most significant bit at bit Lbits due to the carry; this happens when the ambiguity of leading bits of L and H is resolved to match the H leading bits. The step newbyte>0xFF detects the carry. Now an AggrByteout_RenormE call proceeds as follows:
   LM1R=LM1(R)=5
   leftsh=8−LM1R=3
   Lbits=Lbits+leftsh=19
   R=R<<leftsh=1 0yyy y000
   L=L<<leftsh=1000 0000 1000 0xxx x000
   (Lbits<18)=false
   Lbits−=8 [so Lbits=11]
   newbyte=(L>>Lbits) & 0x1FF=1 0000 0001,
   L &=((1<<Lbits)−1)=000 0xxx x000
   (newbyte>0xFF)=true
   PutByte(OSByte+1) [writes OSByte+1 to bitstream, the +1 is the carry]
   Put0Bytes(OSFFs) [writes any positive OSFFs as 0 bytes]
   OSByte=newbyte & 0xFF=0000 0001
   OSFFs=0

The output of OSByte (which is essentially newbyte from a prior renormalization) rather than the current newbyte allows for a current carry by OSByte+1.

5. Modifications

The preferred embodiments may be modified in various ways while retaining one or more of the features of analyzing bit sections of a current interval endpoint or aggregating up to bytes for the encoder renormalization.

For example, the number of bits in the interval range and endpoint could be varied; the current interval range and upper endpoint could be used in place of the range and lower endpoint with corresponding changes; the size of the groups of bits output could be varied from a byte to other sizes; and so forth.

What is claimed is:

1. A method of binary arithmetic encoding renormalization, comprising:
   (a) providing an input M-bit current interval range and an input N-bit current interval endpoint where M and N are positive integers and N is at least M+K+1 where K is an integer greater than 1;

(b) providing an input bit count for said endpoint;

(c) left shifting said range by the number of leading 0s of said range, and updating said range as the M least significant bits of said shifted range;

(d) left shifting said endpoint by said number of leading 0s of said range;

(e) increasing said bit count by said number of leading 0s of said range;

(f) when said increased bit count is at least N:
  (1) decrementing said increased bit count by K and updating said bit count as said decremented increased bit count,
  (2) forming a (K+1)-bit Word as the K+1 least significant bits of a right shift of said left shifted endpoint where said right shift is by said updated bit count number of bits, and
  (3) updating said endpoint as the updated-bit-count least significant bits of said left shifted endpoint together with any needed left padding 0s;

(g) when said Word has a most significant bit=1:
  (1) adding 1 to an outstanding K-bit number;
  (2) outputting the results of (1);
  (3) outputting a set of K-bit 0s according to an outstanding counter;
  (4) updating said outstanding K-bit number as the K least significant bits of said Word; and
  (5) resetting said outstanding counter to 0;

(h) when said Word has a most significant bit=0 and all other bits=1, incrementing said outstanding counter; and (i) when said Word has a most significant bit=0 and another bit=0:
  (1) outputting said outstanding K-bit number;
  (2) outputting K-bit numbers according to said outstanding counter;
  (3) updating said K-bit number as the K least significant bits of said Word; and
  (4) resetting said outstanding counter to 0.

2. The method of claim 1, wherein:
(a) M=9;
(b) K=8; and
(c) N=18.

3. A method of binary arithmetic encoding renormalization, comprising:

(a) providing an input M-bit current interval range and an input N-bit current interval endpoint where said M and N are positive integers with N=M+1;

(b) left shifting said range by S bits where S is the number of leading 0s of said range, and updating said range as the M least significant bits of said shifted range;

(c) when the most significant two bits of said endpoint are 00:
  (1) outputting a 0 plus K 1's where K is a non-negative integer indicating a number of outstanding bits,
  (2) when the S+1 most significant bits of endpoint have a rightmost 0 bit, outputting said S+1 bits except for the leftmost 0 bit and the rightmost 0 bit, setting K=0, and left shifting said endpoint by S bits and discarding beyond N bits;
  (3) when the S+1 most significant bits of endpoint have a rightmost 1, outputting said S+1 bits except for the leftmost 0 bit and said rightmost 1 bit plus all adjoining 1 bits, setting K=the number of said rightmost 1 bit plus adjoining 1 bits, and left shifting said endpoint by S bits and discarding beyond N bits;

(d) when the most significant bits of said endpoint is 1:
  (1) outputting a 1 plus K 0's,
  (2) when the S+1 most significant bits of endpoint have a rightmost 0 bit, outputting said S+1 bits except for the leftmost 1 bit and the rightmost 0 bit, setting K=0, and left shifting said endpoint by S bits and discarding beyond N bits;
  (3) when the S+1 most significant bits of endpoint have a rightmost 1, outputting said S+1 bits except for the leftmost 1 bit and said rightmost 1 bit plus all adjoining 1 bits, setting K=the number of said rightmost 1 bit plus adjoining 1 bits, and left shifting said endpoint by S bits and discarding beyond N bits;

(e) when the two most significant bits of said endpoint are 01 and F is less than S where F is a non-negative integer indicating a length of a carry chain:
  (1) outputting a 0 plus K+F 1's, (f) when the two most significant bits of said endpoint are 01 and and F is not less than S, incrementing K by S and left shifting endpoint by S with discarding of bits beyond N and zeroing its most significant bit.

4. The method of claim 3, wherein:
(a) N=9.

* * * * *